United States Patent
You et al.

(10) Patent No.: US 10,494,502 B2
(45) Date of Patent: Dec. 3, 2019

(54) HALOGEN-FREE THERMOSETTING RESIN COMPOSITION, PREPREG, LAMINATE AND PRINTED CIRCUIT BOARD COMPRISING THE SAME

(71) Applicant: SHENGYI TECHNOLOGY CO., LTD., Guangdong (CN)

(72) Inventors: Jiang You, Guangdong (CN); Tianhui Huang, Guangdong (CN); Yongjing Xu, Guangdong (CN); Zhongqiang Yang, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 218 days.

(21) Appl. No.: 15/515,230

(22) PCT Filed: Sep. 14, 2016

(86) PCT No.: PCT/CN2016/099093
§ 371 (c)(1),
(2) Date: Mar. 29, 2017

(87) PCT Pub. No.: WO2014/161843
PCT Pub. Date: Sep. 28, 2017

(65) Prior Publication Data
US 2018/0086895 A1    Mar. 29, 2018

(30) Foreign Application Priority Data
Mar. 25, 2016  (CN) .......................... 2016 1 0176723

(51) Int. Cl.
| | |
|---|---|
| *C08K 3/32* | (2006.01) |
| *C08L 63/00* | (2006.01) |
| *C08L 79/04* | (2006.01) |
| *C08K 5/49* | (2006.01) |
| *C08G 59/32* | (2006.01) |
| *C08G 59/40* | (2006.01) |

(52) U.S. Cl.
CPC ............. *C08K 3/32* (2013.01); *C08G 59/3236* (2013.01); *C08G 59/4014* (2013.01); *C08K 5/49* (2013.01); *C08L 63/00* (2013.01); *C08L 79/04* (2013.01); *C08L 2201/02* (2013.01); *C08L 2203/206* (2013.01)

(58) Field of Classification Search
CPC ................................... C08K 3/32; C08K 5/49
See application file for complete search history.

(56) References Cited

U.S. PATENT DOCUMENTS

| | | | |
|---|---|---|---|
| 5,112,932 A | 5/1992 | Koenig et al. | |
| 2007/0221890 A1* | 9/2007 | Gan | C07F 9/657172 |
| | | | 252/601 |
| 2008/0050596 A1* | 2/2008 | Urakawa | C08G 59/28 |
| | | | 428/418 |
| 2016/0264761 A1* | 9/2016 | Timberlake | C08K 5/5317 |

FOREIGN PATENT DOCUMENTS

| | | |
|---|---|---|
| CN | 1333791 A | 1/2002 |
| CN | 1423678 A | 6/2003 |
| CN | 101643570 A | 2/2010 |
| CN | 101925629 A | 12/2010 |
| CN | 103992622 | 8/2014 |
| CN | 104797614 A | 7/2015 |
| CN | 105331053 A | 2/2016 |
| JP | H04506678 | 11/1992 |
| JP | 9-278867 A | 10/1997 |
| JP | 2008501063 | 1/2008 |
| JP | 2015162200 | 9/2015 |
| KR | 20070039060 A | 4/2007 |

OTHER PUBLICATIONS

International Search Report, PCT/CN2016/099093, dated Dec. 28, 2016.

* cited by examiner

*Primary Examiner* — Wenwen Cai
(74) *Attorney, Agent, or Firm* — McDonald Hopkins LLC

(57) ABSTRACT

The present invention provides a halogen-free thermosetting resin composition, a prepreg, a laminate and a printed circuit board comprising the same. The halogen-free thermosetting resin composition comprises, based on 100 parts by weight of organic solids, (A) from 30 to 60 parts by weight of a halogen-free thermosetting resin, (B) from 10 to 35 parts by weight of a phenolic curing agent, and (C) a phosphorus-containing flame retardant. The prepregs, laminates and printed circuit boards prepared from the halogen-free thermosetting resin composition of the present invention have excellent dimensional stability and dielectric properties, high adhesive force, high heat resistance, low water absorption and better processability, and can achieve halogen-free flame retardancy and reach UL94 V-0.

20 Claims, No Drawings

HALOGEN-FREE THERMOSETTING RESIN COMPOSITION, PREPREG, LAMINATE AND PRINTED CIRCUIT BOARD COMPRISING THE SAME

CROSS-REFERENCE TO RELATED APPLICATION

This application is a 35 U.S.C. 371 national stage filing of PCT Application No. PCT/CN2016/099093, filed on Sep. 14, 2016, which claims priority to Chinese Patent Application No. 201610176723.6, filed on Mar. 25, 2016, both of which are incorporated herein in their entirety by reference.

TECHNICAL FIELD

The present invention belongs to the technical field of copper-clad laminates, and specifically relates to a halogen-free thermosetting resin composition, a prepreg, a laminate and a printed circuit board comprising the same.

BACKGROUND ART

Conventional laminates for printed circuit boards achieve flame retardancy by using brominated flame retardants, especially tetrabromobisphenol A type epoxy resin which has better flame retardancy, but will produce hydrogen bromide gas during combustion. In recent years, carcinogens such as dioxin, dibenzofuran and the like have been detected in combustion products of electrical and electronic equipment waste containing halogens such as bromine, chlorine and the like. Thus, the use of brominated epoxy resins is limited. Waste Electrical and Electronic Equipment Directive and the Restriction of the Use of Certain Hazardous Substances in Electrical and Electronic Equipment were formally implemented by European Union on Jul. 1, 2006. The development of halogen-free flame retardant copper-clad laminates has become a hot spot in the industry, and laminate manufacturers have launched their own halogen-free flame retardant copper-clad laminates.

With the refinement, thinning and increased functional requirements of consumer electronics, the thickness and line width of the dielectric layer of the laminate substrate are getting smaller and smaller, and the used fiberglass cloth is getting thinner and thinner. The dielectric layer has to have a sufficiently low dielectric constant (Dk) if it is necessary to keep the impedance constant under the conditions that the line width gets smaller. The thinning of the reinforcing material will lead to the lack of rigidity of the substrate. In the process of PCB processing, it is easy to warp, expand and contract and the like, so as to affect the yield of PCB processing. Therefore, the dimensional stability of the substrate is very important. At the same time, when PCB supports more components, the requirements on the binding force of bonding pad get more prominent, which requires the substrate have a high adhesive force simultaneously. At present, a large part of halogen-free Tg substrates for consumer electronics still use amine curing agents such as DICY and DDS, which have excellent adhesive force, but are inferior in rigidity, dielectric properties and heat resistance, so that they cannot meet the requirements on ultra-thin HDI process.

DISCLOSURE OF THE INVENTION

On such a basis, the first object of the present invention lies in providing a halogen-free thermosetting resin composition. The prepregs, laminates and printed circuit boards prepared from the halogen-free thermosetting resin composition have excellent dimensional stability and dielectric performances, high adhesive force, high rigidity, high heat resistance, low water absorption and better processability, and can achieve halogen-free flame retardancy and reach UL94 V-0.

In order to achieve the aforesaid object, the present invention uses the following technical solution:

A halogen-free thermosetting resin composition, based on 100 parts by weight of organic solids, comprises the following components:

(A) from 30 to 60 parts by weight of a halogen-free epoxy resin, (B) from 10 to 35 parts by weight of a phenolic curing agent, and (C) a phosphorus-containing flame retardant;

wherein the halogen-free epoxy resin comprises the epoxy resin having the structure of formula (a)

Formula (a)

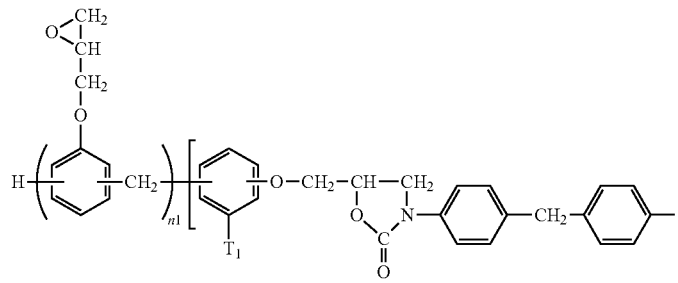
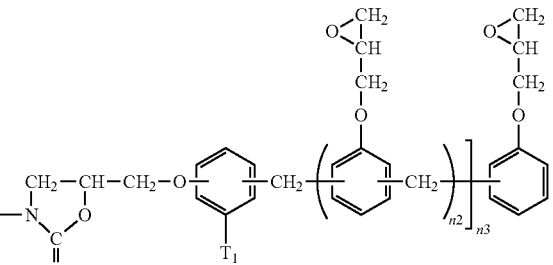

wherein $T_1$ and $T_2$ are each independently selected from the group consisting of hydrogen atom, the structure of formula (I) or ($II_n$); n1 and n3 represent the numbers of repeating units, and are each independently an integer greater than or equal to 1, preferably from 1 to 20, e.g. 2, 3, 4, 5, 6, 8, 10, 15 or 20; n2 represents the number of a repeating unit, and is an integer greater than or equal to 0, preferably from 0 to 20, e.g. 0, 1, 2, 3, 4, 5, 6, 8, 10, 12, 15 or 20;

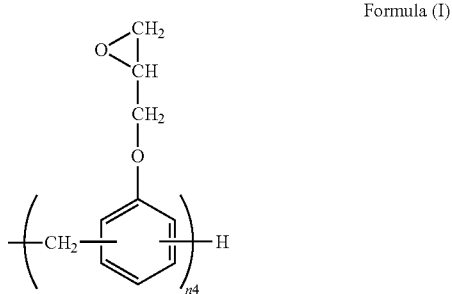

Formula (I)

wherein n4 represents the number of a repeating unit, and is an integer greater than or equal to 1, e.g. 2, 3, 4, 5, 6, 8, 10, 15 or 20;

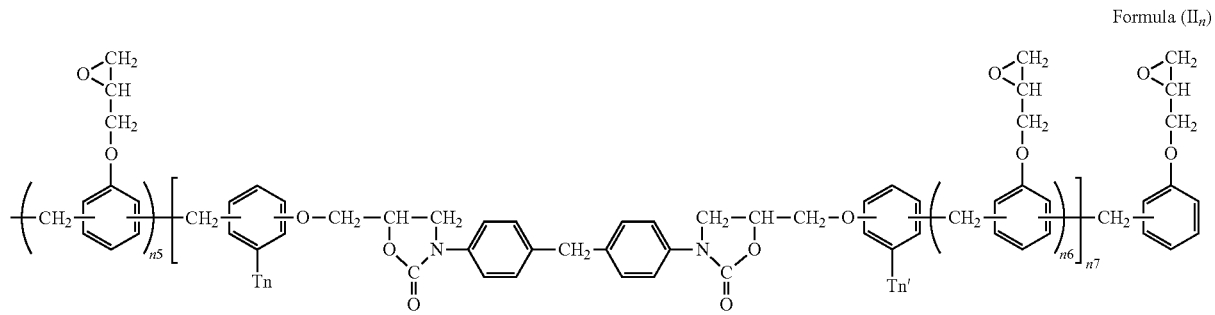

Formula ($II_n$)

wherein $T_n$ and $T_n'$ are each independently selected from the group consisting of hydrogen atom, the structure of formula (I) or ($II_n$), and terminated with hydrogen atom or the structure of formula (I); n is a positive integer greater than or equal to 3; n5 and n6 represent the numbers of repeating units, and are each independently an integer greater than or equal to 0, preferably from 0 to 20, e.g. 2, 3, 4, 5, 6, 8, 10, 15 or 20; n7 represents the number of a repeating unit, and is an integer greater than or equal to 1, preferably from 1 to 20, e.g. 1, 2, 3, 4, 5, 6, 8, 10, 12, 15 or 20.

The epoxy resin having the structure of formula (a) has a molecular weight of 1000-20000, e.g. 1500, 1800, 2000, 2500, 3000, 3500, 4000, 4500, 5000, 7200, 8400, 9600, 12000, 15000, 18000, 19500 and the like.

The epoxy resin having the structure of formula (a) is in an amount of 50 wt. % or more of the halogen-free epoxy resin.

In the epoxy resin having the structure of formula (a) of the present invention, the formula ($II_n$) is not a specific general formula. When n is 3, the formula ($II_3$) has branched chains $T_3$ and $T_3'$, wherein $T_3$ and $T_3'$ are each independently selected from the group consisting of hydrogen atom, formulae (I) and ($II_4$); the formula ($II_4$) has branched chains $T_4$ and $T_4'$, wherein $T_4$ and $T_4'$ are each independently selected from the group consisting of hydrogen atom, formulae (I) and ($II_5$); . . . (looping), the formula ($II_n$) has branched chains $T_n$ and $T_n'$, wherein $T_n$ and $T_n'$ are each independently selected from the group consisting of hydrogen atom, formulae (I) and ($II_n$). However, for the epoxy resin having the structure of formula (a), the structure of formula ($II_n$) cannot get into infinite loops. When the molecular weight reaches 1000-20000 by looping, hydrogen atom or the structure of formula (I) is used to terminate at the end.

In order to achieve the above object, the inventors have made repeated and intensive studies and have found that the above-mentioned object can be achieved by suitably mixing a halogen-free epoxy resin having a specific structure, a phenolic curing agent, a phosphorus-containing flame retardant and other optional substances to obtain a halogen-free thermosetting resin composition.

The present invention adopts a halogen-free epoxy resin with a specific structure as the main resin, which has a symmetrical molecular structure and contains N-containing 5-membered heterocyclic ring structure, has advantages of high glass transition temperature (Tg), high dimensional stability, rigidity and high adhesive force, high heat resistance and good flame retardant and the like.

In addition, the present invention also has excellent dielectric properties, and can reduce the dielectric constant and dielectric loss value of the cured products. Phenolic aldehyde is used as a curing agent, which not only can ensure that the cured products have high dimensional stability and heat resistance, but also can give full play to the advantages of excellent dielectric properties due to the structural regularity.

The present invention not only fully utilizes respective advantages of the above-mentioned three components, but also gives full play to the advantages of each component via the synergistic effects thereof, so that the resultant cured products have excellent dimensional stability and dielectric performances, high adhesive force, high heat resistance, low water absorption and good processability, and can achieve halogen-free flame retardancy of UL94 V-0.

The component (A) in the present invention, i.e. the halogen-free epoxy resin, can provide the cured resin and the laminate produced therefrom with required dielectric properties, dimensional stability, adhesive force, heat resistance, flame retardancy, and mechanical properties.

Based on 100 parts by weight of organic solids, the component (A) halogen-free epoxy resin is added in an amount of 30-60 parts by weight, e.g. 32, 34, 36, 38, 40, 42, 44, 46, 48, 50, 52, 54, 56, 58 or 60 parts by weight.

Preferably, besides the epoxy resin having the structure of formula (a), the component (A) halogen-free epoxy resin further comprises other halogen-free epoxy resins selected from the group consisting of bisphenol A epoxy resin, bisphenol F epoxy resin, phenol novolac epoxy resin, bisphenol A novolac epoxy resin, o-cresol novolac epoxy resin, dicyclopentadiene epoxy resin, isocyanate epoxy resin, phosphorus-containing epoxy resin, Xylok-type epoxy resin and biphenyl epoxy resin, or a mixture of at least two selected therefrom. In the present invention, other halogen-free epoxy resins are in an amount of 0-50 wt. % of the component (A) halogen-free epoxy resin.

Preferably, other halogen-free epoxy resins are selected from phosphorus-containing epoxy resin.

In the present invention, the novel halogen-free epoxy resin having the structure of formula (a) is prepared by the following process, feeding 100 parts of a linear novolac epoxy resin having an epoxy equivalent of about 177 g/eq into a four-necked flask (500 mL) equipped with a polytetrafluoroethylene stirrer, a thermometer, a reflux condenser and a nitrogen inlet tube, heating to 180° C. to 195° C., adding 15-20 parts of diphenylmethane diisocyanate (MDI) having an isocyanate equivalent of 125 g/eq at about 190° C., feeding 2 parts of 2-ethyl-4-methylimidazole (an accelerator) and reacting at 180-195° C. for 12 h, continuously sampling until it is confirmed by FT-IR that the isocyanate peak disappears completely, stopping stirring and heating, removing solvent to obtain a novel halogen-free epoxy resin having an epoxy equivalent of 230 to 260 g/eq and a softening point of 70 to 80° C.

The component (B) phenolic curing agent, based on 100 parts by weight of organic solids, imparts excellent dielectric properties to the cured products while ensuring that the cured products have excellent dimensional stability and heat resistance. It is added in an amount of 10-35 parts by weight, e.g. 12, 14, 16, 18, 20, 22, 24, 26, 28, 30, 32 or 34 parts by weight.

Preferably, the component (B) phenolic curing agent is anyone selected from the group consisting of phenolic resins having the following structure, or a mixture of at least two selected therefrom:

$$\begin{array}{cccc} OH & OH & OH \\ | & | & | \\ X_1 \!-\!\!\left(\!Y_1 \!-\! X_2 \!-\! Y_2 \!-\! X_3\!\right)_{\!m}\!\!-\! H \end{array}$$

wherein $X_1$, $X_2$ and $X_3$ are each independently selected from the group consisting of

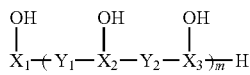

wherein $R_1$ is anyone selected from the group consisting of hydrogen atom, substituted or unsubstituted $C_1$-$C_5$ linear alkyl, and substituted or unsubstituted $C_1$-$C_5$ branched alkyl;

$Y_1$ and $Y_2$ are each independently anyone selected from the group consisting of single bond, —$CH_2$—,

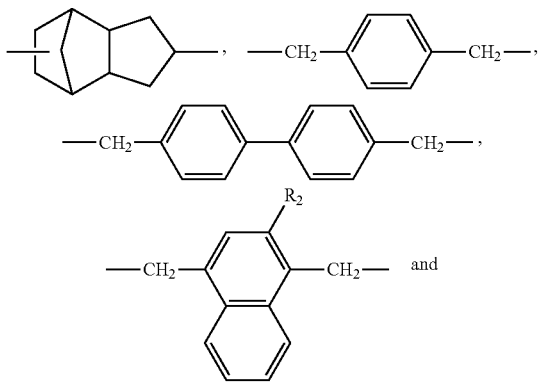

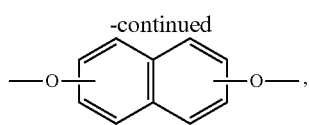

wherein $R_2$ is anyone selected from the group consisting of hydrogen atom, substituted or unsubstituted $C_1$-$C_5$ linear alkyl, and substituted or unsubstituted $C_1$-$C_5$ branched alkyl; and m is an integer selected from 1-10, e.g. 2, 3, 4, 5, 6, 7, 8, 9 or 10.

The component (C) of the present invention, i.e. phosphorus-containing flame retardant, makes the halogen-free thermosetting resin composition have flame retardant property, which satisfies the requirements of UL 94V-0. The addition amount of the flame retardant is determined in accordance with the flame retardancy of the cured products which reaches UL 94V-0 level, and there is no specific definition. Preferably, based on 100 parts by weight of organic solids, the component (C) phosphorus-containing flame retardant is added in an amount of from 5 to 30 parts by weight, e.g. 7, 9, 11, 13, 15, 17, 19, 21, 23, 25, 27 or 29 parts by weight.

Preferably, the component (C) phosphorus-containing flame retardant is anyone selected from the group consisting of tri(2,6-dimethylphenyl)phosphine, 10-(2,5-dihydroxyl phenyl)-9,10-dihydro-9-oxa-10-phosphaphenanthrene-10-oxide, 2,6-di(2,6-dimethylphenyl)phosphinophenyl, 10-phenyl-9,10-dihydro-9-oxa-10-phosphaphenanthrene-10-oxide, phenoxy phosphazene compound, phosphate, polyphosphate, phosphonate or polyphosphonate, or a mixture of at least two selected therefrom. The mixture is selected from the group consisting of a mixture of tri(2,6-dimethylphenyl)phosphine and 10-(2,5-dihydroxyl phenyl)-9,10-dihydro-9-oxa-10-phosphaphenanthrene-10-oxide, a mixture of 2,6-di(2,6-dimethylphenyl)phosphinophenyl and 10-phenyl-9,10-dihydro-9-oxa-10-phosphaphenanthrene-10-oxide, a mixture of phenoxy phosphazene compound, phosphate and polyphosphate, and a mixture of tri(2,6-dimethylphenyl)-phosphine, 10-(2,5-dihydroxylphenyl)-9,10-dihydro-9-oxa-10-phosphaphenanthrene-10-oxide, 2,6-di(2,6-dimethylphenyl)phosphinophenyl, 10-phenyl-9,10-dihydro-9-oxa-10-phosphaphenanthrene-10-oxide, phenoxy phosphazene compound, phosphate and polyphosphate.

Based on 100 parts by weight of organic solids, the halogen-free thermosetting resin composition of the present invention may also contain 0-5 parts by weight of an amine curing agent, which, as the co-curing agent of the phenolic resin, not only can increase the glass transition temperature (Tg) of the cured products, but also can improve the processability. Meanwhile, the amine curing agent is added to promote the reaction of phenolic curing agent and epoxy resin and reduce the curing conditions, so as to reduce energy consumption and improve production efficiency. In addition, the amine curing agent containing N element has excellent adhesive force, to further improve the adhesive force of the cured products. Meanwhile, the amine curing agent has a small equivalent and a high cross-linking density, which can improve the glass transition temperature (Tg) of the cured products, thereby further improving the rigidity and dimensional stability of the cured products. The amine curing agent is added in an amount of 0-5 parts by weight, e.g. 0, 0.4, 0.8, 1.2, 1.6, 2.0, 2.4, 2.8, 3.2, 3.6, 4, 4.4 or 4.8 parts by weight.

Preferably, the amine curing agent is anyone selected from the group consisting of dicyandiamide (DICY), diaminodiphenylsulfone (DDS), diaminodiphenyl ether (DDE) and diaminodiphenylmethane (DDM), or a mixture of at least two selected therefrom. The mixture is selected from the group consisting of a mixture of DICY and DDS, a mixture of DICY and DDE, a mixture of DICY and DDM, and a mixture of DDS and DDE.

The term "based on 100 parts by weight of organic solids" in the present invention means that the sum of the solid content of the organic components in the halogen-free thermosetting resin composition of the present invention is 100 parts by weight. The weight parts of the organic solids are the sum of the weight parts of the resin, the curing agent and the flame retardant. The filler and the curing accelerator are not included in the organic solids. In the present invention, the solids of the halogen-free epoxy resin, phenolic curing agent, phosphorus-containing flame retardant, amine curing agent, and flame retardant are all included in the organic solids of the present invention.

Preferably, the resin composition of the present invention further comprises a filler, which is mainly used for adjusting some physical properties of the composition, such as lowering the coefficient of thermal expansion (CTE), decreasing the water absorption and increasing the thermal conductivity and the like. The filler is in an amount of 0-200 parts by weight, based on 100 parts by weight of the organic solids, not including 0.

Preferably, the filler is selected from organic fillers and inorganic fillers, preferably inorganic fillers, further preferably surface-treated inorganic fillers, most preferably surface-treated silica.

Preferably, the surface-treating agent for surface treatment is anyone selected from the group consisting of silane coupling agent, organosilicone oligomer, or titanate coupling agent, or a mixture of at least two selected therefrom.

Preferably, the surface-treating agent is used in an amount of 0.1 to 5.0 mass %, preferably 0.5 to 3.0 mass %, and more preferably 0.75 to 2.0 mass %, based on 100% by mass of the inorganic filler.

Preferably, the inorganic filler is anyone selected from the group consisting of non-metallic oxides, metal nitrides, non-metallic nitrides, inorganic hydrates, inorganic salts, metal hydrates and inorganic phosphorus, or a mixture of at least two selected therefrom, preferably from molten silica, crystalline silica, spherical silica, hollow silica, aluminum hydroxide, alumina, talc powder, aluminum nitride, boron nitride, silicon carbide, barium sulfate, barium titanate, strontium titanate, calcium carbonate, calcium silicate, mica and glass fiber powder, or a mixture of at least two selected therefrom. The mixture is selected from the group consisting of a mixture of molten silica and crystalline silica, a mixture of spherical silica and hollow silica, a mixture of aluminum hydroxide and alumina, a mixture of talc powder and aluminum nitride, a mixture of boron nitride and silicon carbide, a mixture of barium sulfate and barium titanate, a mixture of strontium titanate, calcium carbonate and calcium silicate, a mixture of mica, glass fiber powder, molten silica and crystalline silica, a mixture of spherical silica, hollow silica, aluminum hydroxide and alumina, a mixture of talc powder, aluminum nitride, boron nitride, silicon carbide, barium sulfate and barium titanate, a mixture of strontium titanate, calcium carbonate, calcium silicate, mica and glass fiber powder.

Preferably, the organic filler is anyone selected from the group consisting of polytetrafluoroethylene powder, polyphenylene sulfide and polyethersulfone powder, or a mixture of at least two selected therefrom. The mixture is selected from the group consisting of a mixture of polytetrafluoroethylene powder and polyphenylene sulfide, a mixture of polytetrafluoroethylene powder and polyethersulfone powder, a mixture of polyphenylene sulfide and polyethersulfone powder, a mixture of polytetrafluoroethylene powder, polyphenylene sulfide and polyethersulfone powder.

Preferably, the best filler is silica. The filler has a median particle size of 1-15 μm, preferably 1-10 μm. The filler within the range of such particle size has better dispersibility.

Preferably, the filler of the present invention is added in an amount of 0-100 parts by weight, not including 0, based on 100 parts by weight of organic solids, preferably 1, 5, 10, 15, 20, 25, 30, 35, 40, 45, 50, 55, 60, 65, 70, 75, 80, 85, 90, 95, or 100 parts by weight.

Preferably, the resin composition of the present invention further comprises a curing accelerator to cure the resins and accelerate the curing speed of the resins. The curing accelerator is added in an amount of 0.01-0.5 parts by weight, based on 100 parts by weight of organic solids, e.g. 0.02, 0.05, 0.08, 0.11, 0.14, 0.17, 0.2, 0.23, 0.26, 0.29, 0.32, 0.35, 0.38, 0.41, 0.44 or 0.47 parts by weight.

Preferably, the curing accelerator is anyone selected from the group consisting of imidazole compounds, derivatives of imidazole compounds, piperidine compounds, Lewis acid and triphenyl phosphine, or a mixture of at least two selected therefrom, preferably 2-methylimidazole, 2-ethyl-4-methylimidazole, 2-phenylimidazole and triphenylphosphine, or a mixture of at least two selected therefrom.

Preferably, the imidazole compounds are anyone selected from the group consisting of 2-methylimidazole, 2-ethyl-4-methylimidazole, 2-phenylimidazole and 2-undecyl-imidazole, or a mixture of at least two selected therefrom.

Preferably, the piperidine compounds are anyone selected from the group consisting of 2,3-diaminopiperidine, 2,5-diaminopiperidine, 2,6-diaminopiperidine, 2-amino-3-methylpiperidine, 2-amino-4-methylpiperidine, 2-amino-3-nitropiperidine, 2-amino-5-nitropiperidine or 2-amino-4,4-dimethylpiperidine, or a mixture of at least two selected therefrom.

The term "comprising/comprise(s)" in the present invention means that, in addition to said components, there may also include other components which impart different characteristics to the halogen-free thermosetting resin composition. In addition to this, the term "comprising/comprise(s)" in the present invention may be replaced by a closed-form "is/are" or "consisting/consist(s) of".

For example, the halogen-free thermosetting resin composition may contain various additives. Specific examples thereof include an antioxidant, a heat stabilizer, an antistatic agent, an ultraviolet absorber, a pigment, a colorant, a lubricant and the like. These various additives may be used alone or in combination of two or more.

The glue solution of the halogen-free thermosetting resin composition of the present invention is prepared by conventional process of: firstly putting solid materials, then adding a liquid solvent, stirring until the solid materials are completely dissolved, adding a liquid resin and a curing accelerator, continuing to stir homogeneously, and finally adjusting with a solvent the solid content of the solution to 65%-75% to obtain a glue solution.

The present invention further discloses a prepreg comprising a reinforcing material and the above halogen-free thermosetting resin composition attached thereon after impregnation and drying.

The prepreg of the present invention is prepared from the halogen-free thermosetting resin composition described above by heating and drying, wherein the base materials used therein are nonwoven fabrics or other fabrics, such as natural fibers, organic synthetic fibers and inorganic fibers.

The reinforcing materials such as glass cloth are impregnated with the aforesaid glue solution, and the impregnated reinforcing materials are dried in an oven at 155° C. for 4-8 minutes to prepare a prepreg.

The present invention further discloses a laminate comprising at least one prepreg as stated above.

A metal-clad laminate comprises at least one superimposed prepreg as described above and metal foil pressed on one or both sides of the prepreg, and can be molded by heating and pressing. That is, the metal-clad laminate of the present invention comprises a laminate formed by bonding one or more prepregs by heating and pressing, and metal foil bonded to one or both sides of the laminate.

An exemplary metal-clad laminate is produced by laminating one prepreg and two sheets of metal foils of 0.5 oz. (having a thickness of 18 μm) by a hot press, so as to form a double-sided metal-clad laminate. The laminating must meet the following requirements: (1) the temperature rising rate of lamination should usually be controlled at 1.5-2.5° C./min when the materials have a temperature of 80-120° C.; (2) pressure settings of lamination; a full pressure of about 350 psi is carried out when the outer materials have a temperature of 120-150° C.; (3) during the curing, the material temperature is controlled at 180° C., and retains for 90 min. The metal foil is selected from the group consisting of a copper foil, a nickel foil, an aluminum foil, and an SUS foil or the like, and the material thereof is not limited.

The present invention further discloses a printed circuit board comprising at least one prepreg as stated above.

As compared to the prior art, the present invention has the following beneficial effects.

The present invention discloses using a halogen-free epoxy resin having a specific structure as the primary resin, which has high structure symmetry and contains five-membered heterocyclic structure, and has excellent dimensional stability and adhesive force, besides high glass transition temperature, excellent dielectric properties, high heat resistance, better flame retardant and the like. The use as the primary resin can improve the modulus, dimensional stability and adhesive force of the cured products. In addition, the halogen-free epoxy resin containing N element, has synergistic effect together with phosphorus-containing flame retardants, and can reduce the phosphorus content as required for the flame retardancy reaching UL 94V-0.

In addition, the present invention discloses that phenolic resin is used as a curing agent, which not only can ensure that the cured products have rigidity and heat resistance, but also can give full play to the advantages of excellent dielectric properties due to structural regularity.

Moreover, an amine curing agent may also be added into the halogen-free thermosetting resin composition of the present invention. The amine curing agent containing N element has excellent adhesive force, to further improve the adhesive force of the cured products. Meanwhile, the amine curing agent has a small equivalent and a high cross-linking density, which can improve the glass transition temperature (Tg) of the cured products, thereby further improving the rigidity and dimensional stability of the cured products.

In conclusion, the prepregs and laminates prepared from the halogen-free thermosetting resin composition of the present invention have excellent dimensional stability and dielectric properties, high adhesive force, high heat resistance, low water absorption and better processability, and can achieve halogen-free flame retardancy and reach UL94 V-0.

EMBODIMENTS

The technical solution of the present invention is further explained by the following embodiments.

The glass transition temperature, dimensional stability, dielectric constant, dielectric loss factor, peeling strength, heat resistance, water absorption, and flame retardancy were measured for the printed circuit laminate (1 prepreg), and the following examples are used for describing in detail.

Please refer to Preparation Example 1, Examples 1-7 and Comparison Examples 1-6.

Preparation Example 1 Preparation of Novel Halogen-Free Epoxy Resin Having the Structure of Formula (a)

Feeding 100 parts of a linear novolac epoxy resin having an epoxy equivalent of about 177 g/eq into a four-necked flask (500 mL) equipped with a polytetrafluoroethylene stirrer, a thermometer, a reflux condenser and a nitrogen inlet tube, heating to 180° C. to 195° C., adding 15-20 parts of diphenylmethane diisocyanate (MDI) having an isocyanate equivalent of 125 g/eq at about 190° C., feeding 2 parts of 2-ethyl-4-methylimidazole (an accelerator) and reacting at 180-195° C. for 12 h, continuously sampling until it was confirmed by FT-IR that the isocyanate peak disappeared completely, stopping stirring and heating, removing solvent to obtain a novel halogen-free epoxy resin having an epoxy equivalent of 230-260 g/eq and a softening point of 70-80° C.

The examples of the present invention are described in detail below, but the present invention is not limited by the examples. Unless otherwise specified, the term "parts" represents "parts by weight", and "%" represents "wt. %".

(A) halogen-free epoxy resin;

(A-1) novel halogen-free epoxy resin (the preparation process being described above, the structure thereof being the structure of Formula (a), having an epoxy equivalent of 246 g/eq);

(A-2) linear phenolic epoxy resin KEP-1138 (trade name from KOLON, Korea);

(A-3) dicyclopentadiene-type epoxy resin HP-7200H (trade name from Dainippon Ink);

(A-4) isocyanate-modified epoxy resin XZ-97103 (trade name from DOW, USA);

(B) phenolic resin;

(B-1) dicyclopentadiene-type phenolic resin PD9110 (trade name from Taiwan Changchun);

(B-2) biphenyl-type phenolic resin MEH-7851H (trade name from Meiwa Plastic Industries, Ltd, Japan);

(B-3) linear phenolic resin;

(C) amine curing agent;

(C-1) dicyandiamide DICY (trade name from Ningxia Daiei);

(C-2) diaminodiphenyl sulfone (trade name from Taiwan Yin Health);

(D) phosphorus-containing flame retardant

XZ92741 (trade name from DOW, USA);

(E) 2-phenylimidazole (trade name from Shikoku Chemicals Corporation, Japan);

(F) filler spherical silica powder (having an average particle diameter of 1 to 10 μm and a purity of 99% or more).

TABLE 1

Formulations of each example and Comparison example and physical properties thereof

|  | Example 1 | Example 2 | Example 3 | Example 4 | Example 5 | Example 6 | Example 7 |
|---|---|---|---|---|---|---|---|
| A-1 | 40 | 30 | 30 | 48 | 60 | 48 | 40 |
| A-2 | — | 5 | 30 | — | — | — | — |
| A-3 | — | — | — | — | — | — | — |
| A-4 | — | — | — | — | — | — | — |
| B-1 | 30 | 35 | 10 | 26 | 15 | — | 30 |
| B-2 | — | — | — | — | — | 26 | — |
| B-3 | — | — | — | — | — | — | — |
| C-1 | — | — | 3 | 1 | 1 | 1 | — |
| C-2 | — | — | — | — | 4 | — | — |
| D | 30 | 30 | 22 | 25 | 20 | 25 | 30 |
| E | q.s | q.s | q.s | q.s | q.s | q.s | — |
| F | 40 | 40 | 60 | 80 | 40 | 40 | — |
| Glass transition temperature (DSC)° C. | 160 | 164 | 178 | 165 | 175 | 160 | 161 |
| Dimensional change rate (ppm) Radial | −747 | −774 | −725 | −690 | −783 | −804 | −834 |
| Dimensional change rate (ppm) Zonal | −580 | −592 | −550 | −468 | −602 | −595 | −625 |
| Dielectric constant (1 GHz) | 3.57 | 3.58 | 3.61 | 3.63 | 3.59 | 3.52 | 3.43 |
| Dielectric loss (1 GHz) | 0.0082 | 0.0085 | 0.0078 | 0.0075 | 0.0077 | 0.0079 | 0.0091 |
| Peeling strength (N/mm) | 1.20 | 1.21 | 1.24 | 1.20 | 1.24 | 1.25 | 1.32 |
| Water absorption (%) | 0.07 | 0.07 | 0.07 | 0.07 | 0.08 | 0.08 | 0.09 |
| Dip soldering resistance, 288° C., s | >120 | >120 | >120 | >120 | >120 | >120 | >120 |
| Flammability | V-0 | V-0 | V-0 | V-0 | V-0 | V-0 | V-0 |

TABLE 2

Formulations of each example and Comparison example and physical properties there of

|  | Comparison Example 1 | Comparison Example 2 | Comparison Example 3 | Comparison Example 4 | Comparison Example 5 | Comparison Example 6 |
|---|---|---|---|---|---|---|
| A-1 | — | — | — | 48 | 20 | 70 |
| A-2 | 48 | — | — | — | 28 | — |
| A-3 | — | 48 | — | — | — | — |
| A-4 | — | — | 48 | — | — | — |
| B-1 | 26 | 26 | 26 | — | 26 | 15 |
| B-2 | — | — | — | — | — | — |
| B-3 | — | — | — | 26 | — | — |
| C-1 | 1 | 1 | 1 | 1 | 1 | 2 |
| C-2 | — | — | — | — | — | — |
| D | 25 | 25 | 25 | 25 | 25 | 13 |
| E | q.s | q.s | q.s | q.s | q.s | — |
| F | 40 | 40 | 40 | 40 | 40 | — |
| Glass transition temperature (DSC)° C. | 168 | 161 | 166 | 173 | 176 | 169 |
| Dimensional change rate (ppm) Radial | −1048 | −884 | −1021 | −855 | −977 | −995 |
| Dimensional change rate (ppm) Zonal | −817 | −679 | −789 | −613 | −764 | −758 |
| Dielectric constant (1 GHz) | 3.91 | 3.58 | 3.87 | 3.92 | 3.83 | 3.85 |
| Dielectric loss (1 GHz) | 0.0104 | 0.0080 | 0.0099 | 0.0112 | 0.0107 | 0.099 |
| Peeling strength (N/mm) | 1.07 | 0.99 | 1.17 | 1.20 | 1.21 | 1.23 |
| Water absorption (%) | 0.09 | 0.07 | 0.10 | 0.08 | 0.08 | 0.10 |
| Dip soldering resistance, 288° C., s | >120 | >120 | >120 | >120 | >120 | >120 |
| Flammability | V-0 | V-1 | V-0 | V-0 | V-0 | V-1 |

The test methods of the above characteristics are stated as follows.

(a) glass transition temperature (Tg)

measured according to differential scanning calorimetry (DSC) by the DSC method specified in IPC-TM-650 2.4.25.

(b) dimensional stability measured according to the method under IPC-TM-650 2.4.39, respectively measuring the dimension of Sample A and the dimension after treatment, calculating the dimensional change rate of radial and zonal directions; the sample being treated under the conditions of 2 h/150° C.

(c) dielectric constant and dielectric loss factor measuring the dielectric constant and dielectric loss factor at 1 GHz by the resonance method using strip lines according to IPC-TM-650 2.5.5.5.

(d) peeling strength testing the peeling strength of the metal cap layer under the test conditions of "after thermal stress" according to the method under IPC-TM-650 2.4.8.

(e) water absorption measured according to the method under IPC-TM-650 2.6.2.1.

(f) dip soldering resistance observing the stratifying and bubbling time according to IPC-TM-650 2.4.13.1.

(g) Flammability measured according to the UL 94 vertical combustion method.

From the physical property data in Tables 1 and 2, it could be found that the dielectric constant and dielectric loss are higher, and the peeling strength is lower when a specific phenolic curing agent and an amine curing agent are used to co-cure a linear phenolic epoxy in Comparison Example 1. Comparison Example 2 discloses a specific phenolic curing agent and an amine curing agent are used to co-cure dicyclopentadiene-type phenolic epoxy. The resultant copper-clad laminate has a poor dimensional stability, a lower peeling strength, and a flame retardancy of only UL V-1 Level. Comparison Example 3 discloses a specific phenolic curing agent and an amine curing agent are used to co-cure isocyanate-modified epoxy. The resultant copper-clad laminate has worse dielectric properties and dimensional stability. Comparison Example 4 discloses a common linear phenolic curing agent and an amine curing agent are used to co-cure a halogen-free epoxy resin. The resultant copper-clad laminate has worse dielectric properties, so that it could not meet the demands on thinness and shortness of consumer electronics. Comparison Example 5 discloses a dicyclopentadiene-type phenolic curing agent and an amine curing agent are used to co-cure an epoxy resin, wherein the novel halogen-free epoxy resin is in a ratio of less than 50% of the epoxy resin. The resultant copper-clad laminate has a worse dimensional stability and dielectric properties. Comparison Example 6 discloses a dicyclopentadiene-type phenolic curing agent and an amine curing agent are used to co-cure a large amount of the novel halogen-free epoxy resin in a ratio of higher than 70 parts by weight. The resultant copper-clad laminate has a general dimensional stability and dielectric properties, a higher water absorption, and insufficient flame retardancy, and could not reach the V-0 level.

In Examples 1-7, a specific phenolic curing agent is used alone or in combination with an amine curing agent to cure the epoxy resin. The resultant copper-clad laminate has higher glass transition temperature, excellent dimensional stability and dielectric properties, high peeling strength and high heat resistance, and can achieve halogen-free flame retardancy and reach UL94 V-0.

As stated above, the laminates for printed circuits of the present invention have more excellent dimensional stability and dielectric properties, high adhesive force, high heat resistance, low water absorption and better processability, and are suitable for high density interconnected fields. In addition, the laminates of the present invention can achieve the V-0 standard in the flammability test UL94 with a halogen content within the scope of JPCA halogen-free standard requirements and have environmental protection effect.

The applicant declares that the present invention discloses the detailed process via the aforesaid examples. However, the present invention is not limited by the aforesaid detailed process. That is to say, it does not mean that the present invention cannot be carried out unless the aforesaid detailed process is used. Those skilled in the art shall know that any improvement, equivalent replacement of various raw materials of the present invention, addition of auxiliary ingredients, selection of specific modes and the like all fall within the protection scope and disclosure of the present invention.

The invention claimed is:

1. A halogen-free thermosetting resin composition, based on 100 parts by weight of organic solids, comprising the following components:
    (A) from 30 to 60 parts by weight of a halogen-free epoxy resin;
    (B) from 10 to 35 parts by weight of a phenolic curing agent; and
    (C) a phosphorus-containing flame retardant,
    wherein the halogen-free epoxy resin comprises the epoxy resin having the structure of Formula (a):

Formula (a)

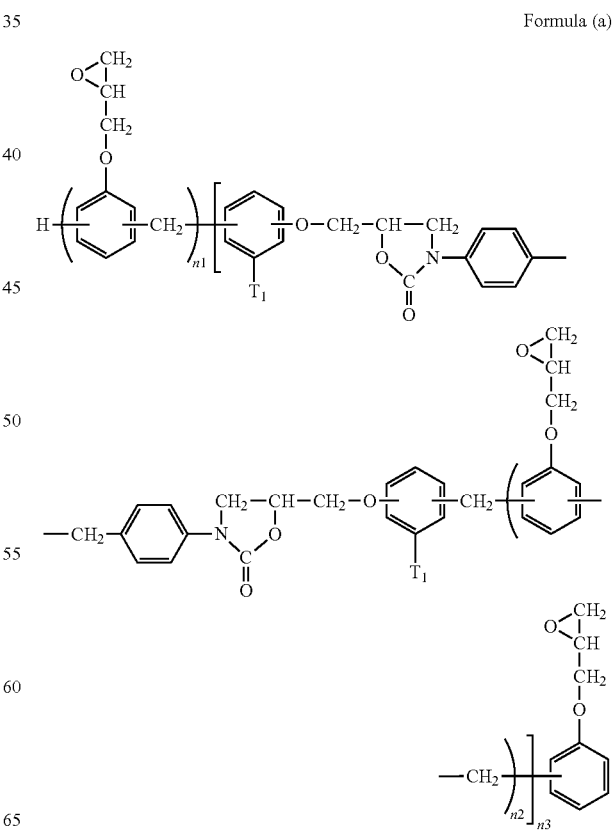

wherein $T_1$ and $T_2$ are each independently selected from the group consisting of a hydrogen atom or a structure according to Formula (I), wherein n1 and n3 represent the numbers of repeating units and are each independently an integer greater than or equal to 1, wherein n2 represents the number of a repeating unit and is an integer greater than or equal to 0,

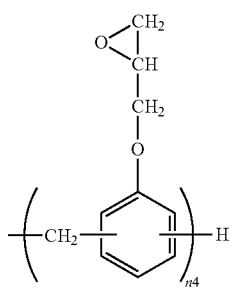

Formula (I)

wherein n4 represents the number of a repeating unit, and is an integer greater than or equal to 1, wherein the epoxy resin having the structure of Formula (a) has a molecular weight of 1000-20000, and wherein the epoxy resin having the structure of Formula (a) is in an amount of 50 wt. % or more of the halogen-free epoxy resin.

2. The halogen-free thermosetting resin composition of claim 1, wherein besides the epoxy resin having the structure of Formula (a), the component (A) halogen-free epoxy resin further comprises other halogen-free epoxy resins selected from the group consisting of bisphenol A epoxy resin, bisphenol F epoxy resin, phenol novolac epoxy resin, bisphenol A novolac epoxy resin, o-cresol novolac epoxy resin, dicyclopentadiene epoxy resin, isocyanate epoxy resin, phosphorus-containing epoxy resin, Xylok-type epoxy resin, biphenyl epoxy resin, or a mixture of at least two selected therefrom.

3. The halogen-free thermosetting resin composition of claim 1, wherein the phenolic curing agent of component (B) is one or more phenolic resins selected from the group consisting of phenolic resins having the following structure, or a mixture of at least two selected therefrom:

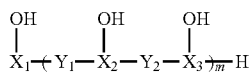

wherein $X_1$ is

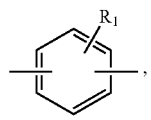

where one of the floating bonds is a hydroxyl group attached to $X_1$ as shown above, wherein $X_2$ and $X_3$ are each

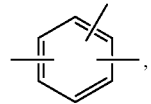

where one of the floating bonds is a hydroxyl group attached to $X_2$ and $X_3$ as shown above, wherein $R_1$ is selected from the group consisting of a hydrogen atom, a substituted $C_1$-$C_5$ linear alkyl, an unsubstituted $C_1$-$C_5$ linear alkyl, a substituted $C_1$-$C_5$ branched alkyl, or an unsubstituted $C_1$-$C_5$ branched alkyl, wherein $Y_1$ and $Y_2$ are each independently selected from the group consisting of a single bond a —$CH_2$—

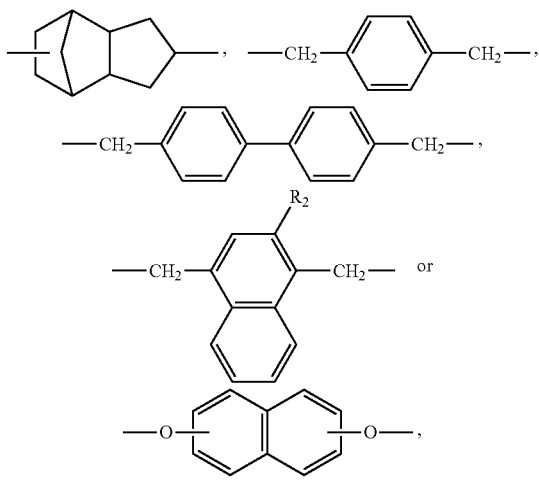

wherein $R_2$ is selected from the group consisting of a hydrogen atom, a substituted $C_1$-$C_5$ linear alkyl, an unsubstituted $C_1$-$C_5$ linear alkyl, a substituted $C_1$-$C_5$ branched alkyl, or an unsubstituted $C_1$-$C_5$ branched alkyl, and wherein m is an integer selected from 1-10.

4. The halogen-free thermosetting resin composition of claim 1, wherein based on 100 parts by weight of organic solids the component (C) phosphorus-containing flame retardant is added in an amount of from 5 to 30 parts by weight.

5. The halogen-free thermosetting resin composition of claim 1, wherein based on 100 parts by weight of organic solids the halogen-free thermosetting resin composition further comprises from 0 to 5 parts by weight of an amine curing agent.

6. The halogen-free thermosetting resin composition of claim 1, wherein based on 100 parts by weight of organic solids the halogen-free thermosetting resin composition further comprises from 0 to 200 parts by weight of a filler, not including 0.

7. The halogen-free thermosetting resin composition of claim 1, wherein the halogen-free thermosetting resin composition further comprises a curing accelerator.

8. The halogen-free thermosetting resin composition of claim 2, wherein the other halogen-free epoxy resin is a phosphorus-containing epoxy resin.

9. The halogen-free thermosetting resin composition of claim 1, wherein component (C) phosphorus-containing flame retardant is selected from the group consisting of tri(2,6-dimethylphenyl)phosphine, 10-(2,5-dihydroxylphenyl)-9,10-dihydro-9-oxa-10-phosphaphenanthrene-10-oxide, 2,6-di(2,6-dimethylphenyl)phosphinophenyl, 10-phenyl-9,10-dihydro-9-oxa-10-phosphaphenanthrene-10-oxide, phenoxyphosphazene compound, phosphate, polyphosphate, phosphonate, polyphosphonate, or a mixture of at least two selected therefrom.

10. The halogen-free thermosetting resin composition of claim 5, wherein the amine curing agent is selected from the group consisting of dicyandiamide, diaminodiphenylsulfone, diaminodiphenyl ether, and diaminodi-phenylmethane, or a mixture of at least two selected therefrom.

11. The halogen-free thermosetting resin composition claimed of claim 6, wherein the filler is selected from the group consisting of organic fillers and inorganic fillers.

12. The halogen-free thermosetting resin composition of claim 6, wherein the filler is surface-treated inorganic fillers, wherein the surface-treating agent for surface treatment is selected from the group consisting of a silane coupling agent, an organic silicone oligomer, a titanate coupling agent, or a mixture of at least two selected therefrom, and wherein the surface-treating agent is used in an amount of 0.1-5.0 mass %, based on 100 mass % of the inorganic filler.

13. The halogen-free thermosetting resin composition of claim 11, wherein the inorganic filler is selected from the group consisting of non-metallic oxides, metal nitrides, non-metallic nitrides, inorganic hydrates, inorganic salts, metal hydrates, inorganic phosphorus, or a mixture of at least two selected therefrom, and wherein the organic filler is selected from the group consisting of a polytetrafluoroethylene powder, a polyphenylene sulfide, a polyethersulfone powder, or a mixture of at least two selected therefrom.

14. The halogen-free thermosetting resin composition of claim 6, wherein the filler is silica and the filler has a median particle size of 1-15 μm, and wherein the filler in the halogen-free thermosetting resin composition is added in an amount of 0-100 parts by weight, not including 0, based on 100 parts by weight of organic solids.

15. The halogen-free thermosetting resin composition of claim 7, wherein the curing accelerator is added in an amount of 0.01-0.5 parts by weight based on 100 parts by weight of the total amounts of components (A), (B) and (C).

16. The halogen-free thermosetting resin composition of claim 7, wherein the curing accelerator is selected from the group consisting of imidazole compounds, derivatives of imidazole compounds, piperidine compounds, Lewis acid, triphenyl phosphine, or a mixture of at least two selected therefrom.

17. The halogen-free thermosetting resin composition of claim 16, wherein the imidazole compounds are selected from the group consisting of 2-methylimidazole, 2-ethyl-4-methylimidazole, 2-phenylimidazole, 2-undecyl-imidazole, or a mixture of at least two selected therefrom, and wherein the piperidine compounds are selected from the group consisting of 2,3-diaminopiperidine, 2,5-diaminopiperidine, 2,6-diaminopiperidine, 2-amino-3-methylpiperidine, 2-amino-4-methylpiperidine, 2-amino-3-nitropiperidine, 2-amino-5-nitropiperidine, 2-amino-4,4-dimethylpiperidine, or a mixture of at least two selected therefrom.

18. A prepreg comprising a reinforcing material and the halogen-free thermosetting resin composition of claim 1 attached thereon after impregnation and drying.

19. A laminate comprising at least one of the prepreg claimed of claim 18.

20. A printed circuit board comprising at least one of the prepreg claimed of claim 18.

* * * * *